United States Patent [19]

Reiser

[11] 4,215,236

[45] Jul. 29, 1980

[54] JUNCTION BOX FOR ELECTROCARDIOGRAPHIC LEADS

[75] Inventor: Gerald J. Reiser, Milwaukee, Wis.

[73] Assignee: Marquette Electronics, Inc., Milwaukee, Wis.

[21] Appl. No.: 889,635

[22] Filed: Mar. 24, 1978

[51] Int. Cl.[2] .............................................. H05K 5/04

[52] U.S. Cl. ..................................... 174/59; 128/696; 339/28; 339/113 R; 339/121; 339/141

[58] Field of Search .............. 174/59, 60; 128/2.06 R, 128/2.06 E, 2.06 B; 339/150 T, 198 R, 198 J, 198 S, 198 C, 198 E, 28, 141, 113 R, 113 B, 121, 137

[56] References Cited

U.S. PATENT DOCUMENTS

| | | | |
|---|---|---|---|
| 1,580,879 | 4/1926 | Evans | 339/137 |
| 3,029,820 | 4/1962 | Franklin | 128/2.06 E X |
| 3,732,868 | 5/1973 | Willems et al. | 128/2.06 A X |
| 3,757,778 | 9/1973 | Graham | 128/2.06 B X |

*Primary Examiner*—B. A. Reynolds
*Assistant Examiner*—D. A. Tone
*Attorney, Agent, or Firm*—Andrus, Sceales, Starke & Sawall

[57] ABSTRACT

An improved junction box for electrocardiographic leads has a somewhat T-shaped housing formed of a pair of separable halves containing a pair of metal plates. Connections for the electrocardiographic leads are mounted along the periphery of the metal plates. The pair of metal plates are made as identical elements to facilitate and economize fabrication of these elements. The junction box is connected to a multi-conductor cable and to an electrocardiograph.

11 Claims, 3 Drawing Figures

JUNCTION BOX FOR ELECTROCARDIOGRAPHIC LEADS

BACKGROUND OF THE INVENTION

1. Field of the Invention

The present invention relates to an improved connector for electrocardiographic leads.

2. Description of the Prior Art

In order to obtain electrical data associated with the physiological functioning of the heart, it is necessary to apply electrodes to the patient's skin, The patient is laid on his back and the electrodes applied at various locations on the chest and on the extremities. The electrodes are connected to leads which, in turn, are connected to the electrocardiograph.

Certain types of cardioanalysis may require as many as fourteen electrodes. It will be appreciated that unless steps are taken, the up to fourteen leads will inevitably become severely entangled on the chest of the patient causing difficulty and uncertainty in the proper placement and connection of the electrodes.

To this end, connectors have been employed which combine the electrode leads into a single, multi-conductor cable. Short electrode leads of the required number are plugged into a junction box at one end of the cable. A multi-prong connector or socket at the other end of the cable connects with the electrocardiograph. Such an arrangement facilitates application of the electrodes to the body and connection to the electrocardiograph.

SUMMARY OF THE PRESENT INVENTION

The present invention is directed to an improved junction box which facilitates use of the electrode leads and has desirable simplicities and economies in manufacture.

Briefly, junction box of the present invention includes a pair of opposed metal plates of generally T-shaped configuration. An insulating housing of similar configuration surrounds the metal plates. The T-shaped configuration of the junction box resembles the human torso and thus assists in the connection and positioning of the electrodes. A plurality of electrode lead connector blocks are mounted along the periphery of the metal plates. The metal plates are identically formed with respect to the location of the connector blocks and so that the connector blocks internest when the plates are brought into an opposing orientation. A multi-conductor cable connects the electrode lead connector blocks with an electrocardiograph.

BRIEF DESCRIPTION OF THE DRAWING

FIG. 3 also shows additional portions of the electrode lead.

DESCRIPTION OF THE PREFERRED EMBODIMENT

Figure 1:
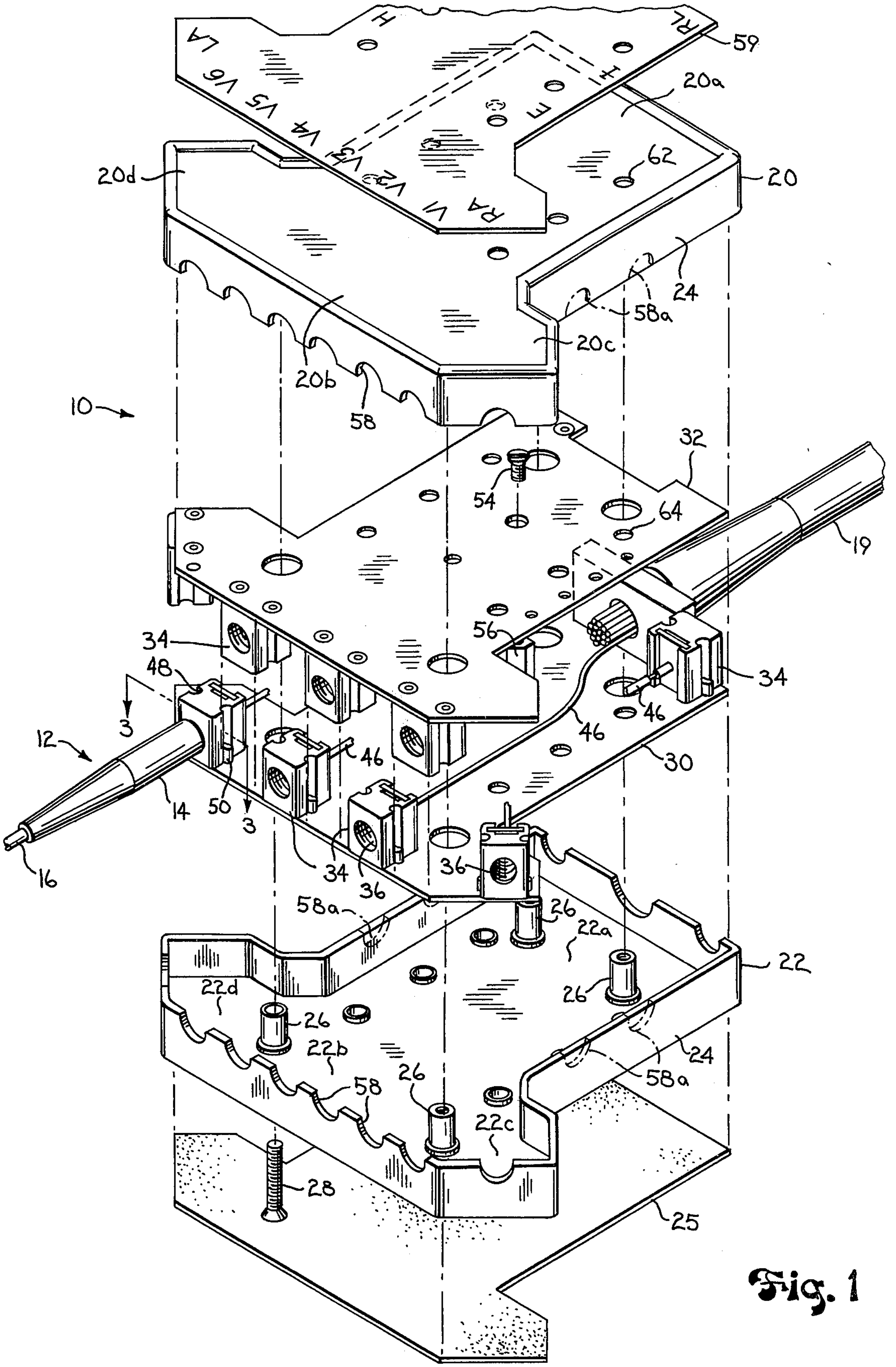
FIG. 1 is an exploded view of the improved electrode lead junction box of the present invention.
Figure 3:
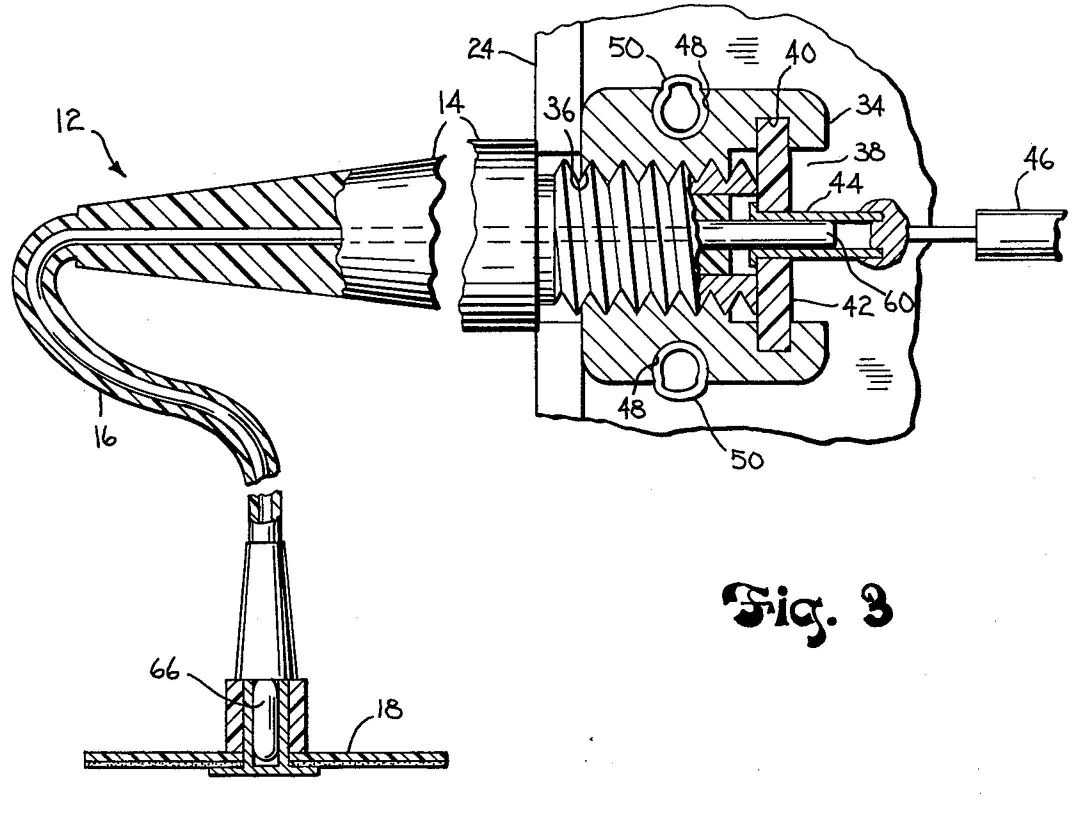
FIG. 3 is an enlarged fragmentary cross-sectional view taken along the line 3-3 of FIG. 1.

In the exploded view of the improved patient cable junction box 10 of the present invention shown in FIG. 1, one of the plurality of electrode leads is shown, as at 12. As shown in FIG. 3, electrode lead 12 includes a threaded connector 14. Connector 14 tapers into lead 16 which is connected to electrode 18. The plurality of such leads are connected to junction box 10 in a manner hereinafter described. Multi-conductor cable 19 has one end coupled to junction box 10 and the other end, not shown, connected to an electro-cardiograph.

Junction box 10 includes upper and lower housing halves 20 and 22 formed of plastic or other suitable material and having side walls 24 which abut when housing halves 20 and 22 are joined together in a manner hereinafter described. The housing halves are generally T-shaped to resemble, in a descriptive sense, the human torso. The half 20 has a generally square central portion *20a* crossed by a portion *20b* having a pair of arm-like extensions *20c* and *20d*. The half 22 is similarly formed to contain portions *22a, 22b, 22c,* and *22d.* The torso like configuration of halves 20 and 22 assist in organizing the connection of leads 12 when the junction box is placed on the chest of the patient.

A piece of material 25 is affixed to the lower surface of lower half 22 to assist in retaining the junction box on the chest of the patient by creating a high degree of friction between the junction box and the garment covering the patient. For this purpose, material 25 may be formed of closed cell neoprene rubber foam material.

Tubes 26 extend upwardly from the inner surface of central portion *22a* as shown in FIG. 1 to abut corresponding tubes, not shown, which extend downwardly from the inner surface of half 20 when the halves are placed together to form the unitary junction box 10. Screws 28 are threaded into tubes 26 to pull halves 20 and 22 together.

A pair of metal plates are formed in a T-shape so as to approximate the interior of each of halves 20 and 22. Metal plate 30 lying in housing half 22 is shown in detail in FIG. 2. Metal plate 30 and the corresponding plate 32 lying in the interior of half 20 are formed of a metal of sufficient thickness to lend a weight to junction box 10 adequate to enable covering 25 to securely engage the garment on the chest of the patient. The metal plates provide shielding against electric and electromagnetic interference to the connections made in junction box 10, hereinafter described.

Figure 2:
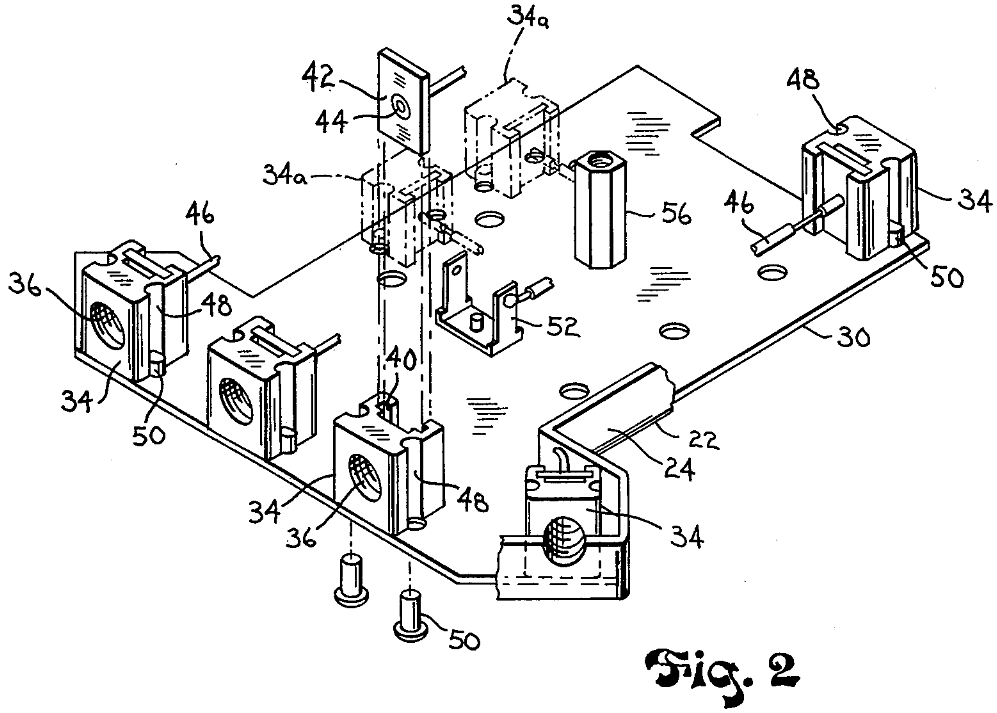
FIG. 2 is a perspective view of the metal plate element of the junction box of the present invention.

Connectors 34 for electrode leads 12 are mounted on the periphery of metal plates 30 and 32 as shown in FIGS. 1 and 2. Each connector 34 is formed in a generally cubical configuration. One surface of the cube is affixed to one of the metal plates, in a manner hereinafter described. A surface normal to that surface contains a threaded hole 36 for receiving electrode lead 12. See also FIG. 3. The side wall opposite that containing threaded hole 36 contains a notch 38, as shown in FIG. 3. The side walls of notch 38 contain recesses 40. Recesses 40 receive the opposing edges of a rectangular piece of insulating material 42, such as the glass reinforced plastic commonly used to make printed circuit boards. The central portion of material 42 contains an electrical connection, such as hollow rivet 44 pressed through the insulating material. An insulated wire 46 is soldered to hollow rivet 44.

Circular grooves 48 are located along the two remaining vertical surfaces of connector 34. Fasteners 50, which may be hollow rivets are placed, through plate 30, in grooves 48 and expanded to firmly affix connector 34 to metal plate 30.

Connector 34 can be conveniently and economically formed by extruding an extrusion containing the grooves 48 and the notch 38, i.e. an extrusion extending into and out or the plane of the paper when the connector 34 is as shown in FIG. 3. The extrusion is then cut at the appropriate length to form the individual connectors.

Connectors 34 are so spaced and located on the periphery of each of metal plates 30 and 32 that when the metal plates are placed in the opposing relationship shown in FIG. 1, the connectors internest so as to provide a closely spaced series of connectors 34 along one edge of junction box 10 for leads 12. By examining FIG. 1, it will be noted that as to the plates and the number and position of the connectors 34, each plate is identically formed with respect to the other. This provides both the nesting feature noted above when the plates are inverted and placed together, and considerable economy in the fabrication of the metal plates.

Prior to assembling plates 30 and 32, the wires 46 extending from the end of cable 19 are connected to rivet 44 in each of connectors 34, one such connection being shown in FIG. 1. The metal plates are grounded by connection of a ground lead to lug 52. Metal plates 30 and 32 are joined together by screw 54 which is threaded in column 56 mounted on plate 30.

After metal plates 30 and 32 are assembled, housing halves 20 and 22 are applied to the upper and lower surfaces of the metal plates 30 and 32, respectively and fastened with screws 28. Semicircular notches 58 in housing halves 20 and 22 provide access to connectors 34. Plastic overlay 50 indicating the various lead connections to be made to connectors 34 is applied to upper housing half 20. These may include designations such as V1, V2, etc. and RA (right arm) located at the appropriate point of torso shaped housing 20. Foam material 25 is fastened to the lower housing half 22.

Electrode lead connector 14 has a threaded terminus beyond which extends prong 60 of connector 12. Electrode lead connector 14 is inserted in hole 36 and rotated to thread the lead into connector 34 and insert prong 60 into rivet 44.

Each electrode lead connector 14 is connected to junction box 12 in the same manner. When the required number of electrodes 12 have been connected, junction box 10 is laid on the patient's chest and electrodes 18 affixed to the skin. The other end of cable 19 is connected to the electrocardiograph. The electrocardiographic data is then transmitted to the electrocardiograph.

While the ten lead connectors 34 of the embodiment of the invention shown in FIG. 1 suffice for most electrocardiographic work, for some types of analysis, fourteen leads are required. In a junction box 10 designed for this latter type of work, two additional connectors 34*a*, shown in phantom in FIG. 2, are provided along the side of plate 30. Two additional connectors are symmetrically provided on plate 32, the rivet holes for same being shown along the side of plate 32 of FIG. 1. Plates 30 and 32 are thus maintained similar and symmetrical. Knock out portions 58*a* in housing halves 20 and 22 are removed to provide access to connectors 34*a*.

As shown in FIG. 1, holes 62 are provided in top body half 20 to mate with holes 64 in upper plate 32. On patients where all leads cannot be placed, for example, because of surgery or a missing limb, the unused leads must be grounded to eliminated electrical interference, such as hum, on the lead. Holes 62 and 64 provide a means of grounding un-used leads by taking the connector, such as banana plug 66, and inserting it in holes 62 and 64.

Various modes of carrying out the invention are contemplated as being within the scope of the following claims particularly pointing out and distinctly claiming the subject matter which is regarded as the invention.

I claim:

1. A junction box for a plurality of electrocardiographic leads comprising:

a pair of opposed plates having a generally T-shaped configuration, said plates being spaced apart by a plurality of lead connector blocks positioned along the periphery of the plates, said connector blocks each being fastened to only one of the plates, said plates being identically formed with respect to shape and the location of the connector blocks on said plates so as to permit internesting of the connector blocks of each of said plates when said plates are brought into the spaced opposed condition, said lead connector blocks having means for receiving said electrocardiographic leads and for making electrical connections therewith;

a multi-conductor cable connected to said connector blocks and exiting said junction box adjacent said plates; and a housing covering said pair of plates and having openings permitting connection of the leads to the connector blocks;

said connector blocks have first and second opposing surfaces abutting said opposing plates, a third surface normal to said first and second surfaces containing said means for receiving said electrocardiographic leads to attach same to the junction box, and a fourth surface having means for establishing a connection between said electrical leads and said cable.

2. The junction box according to claim 1 wherein said connector blocks are formed of as sections of a bar extending parallel to said third and fourth surfaces.

3. The junction box according to claim 1 wherein said plates are formed of electrically conductive material and wherein said housing is formed of an insulating material.

4. The junction box according to claim 3 wherein said plates have sufficient weight for retaining said junction box frictionally in position on the patient's chest.

5. The junction box according to claim 4 wherein said housing includes means for increasing the frictional retention of said junction box on said patient's chest.

6. The junction box according to claim 3 wherein said plates are grounded through said cable and wherein said junction box provides means for grounding electrocardiographic leads.

7. The junction box according to claim 6 wherein said grounding means comprises aligned holes in said housing and one of said plates into which said leads may be inserted.

8. The junction box according to claim 1 wherein said fourth surface of each of said connector blocks contains a notch having a pair of opposing recesses for receiving an electrical connector means for one of said electrocardiographic leads, the conductors of said multi-conductor cable being connected to said connector means within said junction box.

9. The junction box according to claim 8 wherein the connection of said electrical connector means to said conductors of said cable is located between said plates so said plates act as shielding for the connections.

10. The junction box according to claim 1 wherein said housing is formed of a pair of halves surrounding said pair of plates.

11. The junction box according to claim 1 wherein said multi-conductor cable exits from between said plates.

* * * * *